US007861122B2

(12) United States Patent
Cornwell et al.

(10) Patent No.: US 7,861,122 B2
(45) Date of Patent: Dec. 28, 2010

(54) MONITORING HEALTH OF NON-VOLATILE MEMORY

(75) Inventors: Michael J. Cornwell, San Jose, CA (US); Christopher P. Dudte, San Jose, CA (US)

(73) Assignee: Apple Inc., Cupertino, CA (US)

( * ) Notice: Subject to any disclaimer, the term of this patent is extended or adjusted under 35 U.S.C. 154(b) by 414 days.

(21) Appl. No.: 11/341,359

(22) Filed: Jan. 27, 2006

(65) Prior Publication Data
US 2007/0180328 A1  Aug. 2, 2007

(51) Int. Cl.
*G06F 11/00* (2006.01)
(52) U.S. Cl. .............................. 714/42; 714/46; 711/103
(58) Field of Classification Search .................. 714/42, 714/46; 711/103
See application file for complete search history.

(56) References Cited

U.S. PATENT DOCUMENTS

| 4,974,181 | A | * | 11/1990 | Sinderson et al. ........... 702/182 |
| 5,224,070 | A | * | 6/1993 | Fandrich et al. ........ 365/185.33 |
| 5,450,365 | A | | 9/1995 | Adachi |
| 5,473,753 | A | | 12/1995 | Wells et al. |
| 5,577,194 | A | | 11/1996 | Wells et al. |
| 5,592,641 | A | | 1/1997 | Fandrich et al. |
| 5,602,775 | A | | 2/1997 | Vo |
| 5,602,987 | A | | 2/1997 | Harari et al. |
| 5,621,685 | A | | 4/1997 | Cernea et al. |
| 5,633,824 | A | * | 5/1997 | Onuki ................... 365/185.33 |
| 5,671,229 | A | | 9/1997 | Harari et al. |
| 5,719,808 | A | | 2/1998 | Harari et al. |
| 5,737,240 | A | * | 4/1998 | Ellsworth et al. ........... 709/214 |
| 5,848,009 | A | | 12/1998 | Lee et al. |
| 5,880,996 | A | | 3/1999 | Roohparvar |
| 6,014,755 | A | | 1/2000 | Wells et al. |
| 6,052,306 | A | | 4/2000 | Sedlak et al. |
| 6,075,941 | A | * | 6/2000 | Itoh et al. ................... 717/128 |
| 6,081,447 | A | | 6/2000 | Lofgren et al. |
| 6,148,435 | A | | 11/2000 | Bettman |
| 6,149,316 | A | | 11/2000 | Harari et al. |
| 6,249,890 | B1 | * | 6/2001 | Ukani et al. ................. 714/721 |
| 6,260,156 | B1 | | 7/2001 | Garvin et al. |
| 6,269,025 | B1 | | 7/2001 | Hollmer et al. |
| 6,304,487 | B1 | | 10/2001 | Pawletko et al. |
| 6,334,027 | B1 | | 12/2001 | Fukuoka et al. |

(Continued)

FOREIGN PATENT DOCUMENTS

WO  WO 96/17460  6/1996

(Continued)

OTHER PUBLICATIONS

U.S. Appl. No. 11/341,252, Non-Final Office Action, Oct. 30, 2007, pp. 1-10.

(Continued)

*Primary Examiner*—Scott T. Baderman
*Assistant Examiner*—Loan L. T. Truong
(74) *Attorney, Agent, or Firm*—Fish & Richardson P.C.

(57) ABSTRACT

A host processor is coupled to a memory controller and configurable to retrieve from the memory controller information indicative of the health of a non-volatile memory device operatively coupled to the memory controller. A host system uses the information to monitor the health of the non-volatile memory device.

23 Claims, 6 Drawing Sheets

U.S. PATENT DOCUMENTS

| | | | |
|---|---|---|---|
| 6,381,670 B1 | 4/2002 | Lee et al. | |
| 6,426,893 B1 | 7/2002 | Conley et al. | |
| 6,470,413 B1* | 10/2002 | Ogawa | 711/103 |
| 6,516,381 B1 | 2/2003 | Hamilton et al. | |
| 6,542,910 B2* | 4/2003 | Cork et al. | 1/1 |
| 6,567,930 B1* | 5/2003 | Moriya | 714/23 |
| 6,611,724 B1* | 8/2003 | Buda et al. | 700/49 |
| 6,611,907 B1 | 8/2003 | Maeda et al. | |
| 6,639,864 B2 | 10/2003 | Sundaram et al. | |
| 6,662,314 B1* | 12/2003 | Iwata et al. | 714/42 |
| 6,708,289 B1* | 3/2004 | Kudo | 714/28 |
| 6,721,820 B2 | 4/2004 | Zilberman et al. | |
| 6,728,913 B1* | 4/2004 | Parker | 714/723 |
| 6,748,562 B1 | 6/2004 | Krech, Jr. et al. | |
| 6,754,765 B1* | 6/2004 | Chang et al. | 711/103 |
| 6,757,842 B2 | 6/2004 | Harari et al. | |
| 6,763,424 B2 | 7/2004 | Conley | |
| 6,772,276 B2* | 8/2004 | Dover | 711/103 |
| 6,895,464 B2* | 5/2005 | Chow et al. | 711/103 |
| 6,904,506 B2 | 6/2005 | Wu et al. | |
| 6,914,846 B2 | 7/2005 | Harari et al. | |
| 6,947,332 B2 | 9/2005 | Wallace et al. | |
| 6,947,865 B1 | 9/2005 | Mimberg et al. | |
| 6,956,769 B2 | 10/2005 | Lee | |
| 6,982,919 B2 | 1/2006 | Kumahara et al. | |
| 7,013,406 B2 | 3/2006 | Naveh et al. | |
| 7,035,159 B2 | 4/2006 | Janzen et al. | |
| 7,058,748 B1* | 6/2006 | Jacobs et al. | 710/311 |
| 7,065,689 B2* | 6/2006 | Chiu et al. | 714/720 |
| 7,068,456 B2 | 6/2006 | Walz | |
| 7,100,168 B1 | 8/2006 | Wenzl | |
| 7,127,622 B2 | 10/2006 | Schnepper | |
| 7,137,011 B1 | 11/2006 | Harari et al. | |
| 7,161,834 B2 | 1/2007 | Kumahara et al. | |
| 7,162,569 B2 | 1/2007 | Conley et al. | |
| 7,200,066 B2 | 4/2007 | Krenzke et al. | |
| 7,237,046 B2 | 6/2007 | Paley et al. | |
| 7,237,074 B2 | 6/2007 | Guterman et al. | |
| 7,239,557 B2 | 7/2007 | Ha | |
| 7,240,219 B2 | 7/2007 | Teicher et al. | |
| 7,277,978 B2* | 10/2007 | Khatami et al. | 711/103 |
| 7,278,038 B2 | 10/2007 | Schnepper | |
| 7,281,040 B1* | 10/2007 | Ly | 709/224 |
| 7,286,435 B2 | 10/2007 | Odate et al. | |
| 7,304,891 B2 | 12/2007 | Kim | |
| 7,318,181 B2* | 1/2008 | Naso et al. | 714/723 |
| 7,395,466 B2 | 7/2008 | Dempsey | |
| 7,444,490 B2 | 10/2008 | Cases et al. | |
| 7,464,306 B1* | 12/2008 | Furuhjelm et al. | 714/710 |
| 7,480,792 B2 | 1/2009 | Janzen et al. | |
| 7,512,847 B2* | 3/2009 | Bychkov et al. | 714/723 |
| 2003/0021157 A1 | 1/2003 | Matsubara et al. | |
| 2003/0033465 A1 | 2/2003 | Chien et al. | |
| 2003/0041295 A1* | 2/2003 | Hou et al. | 714/710 |
| 2003/0111988 A1 | 6/2003 | Sundaram et al. | |
| 2003/0131185 A1* | 7/2003 | Dover | 711/103 |
| 2004/0049627 A1 | 3/2004 | Piau et al. | |
| 2004/0089717 A1 | 5/2004 | Harari et al. | |
| 2004/0145931 A1 | 7/2004 | Lin et al. | |
| 2004/0157638 A1 | 8/2004 | Moran et al. | |
| 2004/0172576 A1 | 9/2004 | Yoshii et al. | |
| 2004/0174763 A1 | 9/2004 | Schnepper | |
| 2004/0250092 A1 | 12/2004 | Hori et al. | |
| 2004/0268165 A1 | 12/2004 | May et al. | |
| 2005/0044454 A1* | 2/2005 | Moshayedi | 714/54 |
| 2005/0083726 A1 | 4/2005 | Auclair et al. | |
| 2005/0152202 A1 | 7/2005 | Choi et al. | |
| 2005/0188230 A1 | 8/2005 | Bilak | |
| 2005/0204187 A1 | 9/2005 | Lee et al. | |
| 2005/0226050 A1 | 10/2005 | Crosby | |
| 2005/0281112 A1* | 12/2005 | Ito et al. | 365/222 |
| 2006/0005070 A1* | 1/2006 | Zimmer et al. | 714/5 |
| 2006/0010282 A1* | 1/2006 | Kim | 711/103 |
| 2006/0062052 A1 | 3/2006 | Kumahara et al. | |
| 2006/0085670 A1* | 4/2006 | Carver et al. | 714/5 |
| 2006/0126415 A1 | 6/2006 | Matarrese et al. | |
| 2006/0136900 A1* | 6/2006 | Kim et al. | 717/168 |
| 2006/0142977 A1 | 6/2006 | Oh et al. | |
| 2006/0161728 A1 | 7/2006 | Bennett et al. | |
| 2006/0195708 A1 | 8/2006 | Kato et al. | |
| 2006/0203556 A1 | 9/2006 | Chen et al. | |
| 2006/0225073 A1 | 10/2006 | Akagawa et al. | |
| 2006/0280019 A1* | 12/2006 | Burton et al. | 365/226 |
| 2007/0008801 A1 | 1/2007 | Chiang et al. | |
| 2007/0014176 A1 | 1/2007 | Krenzke et al. | |
| 2007/0055843 A1* | 3/2007 | Lameter | 711/206 |
| 2007/0183179 A1 | 8/2007 | Maeda et al. | |
| 2008/0086275 A1* | 4/2008 | Astigarraga et al. | 702/34 |
| 2009/0150748 A1* | 6/2009 | Egner et al. | 714/758 |

FOREIGN PATENT DOCUMENTS

WO     WO 98/15149     9/1998

OTHER PUBLICATIONS

U.S. Appl. No. 11/341,252, Final Office Action, Apr. 16, 2008, pp. 1-14.
U.S. Appl. No. 11/341,252, Non-Final Office Action, Aug. 4, 2008, pp. 1-12.
U.S. Appl. No. 11/341,252, Final Office Action, Feb. 11, 2009, pp. 1-13.
Quantam Fireball SE 2. 1/3.2/4.3/6.4/8.4 GB AT Product Manual, Oct. 1997, Quantum Corporation, pp. 25-30, 50-60, total pp. (25).
K9XXG08UXM—Preliminary Flash Memory—Samsung Electronics, pp. 1-50.
"Common Flash Memory Interface Specification," Release 2.0, Dec. 1, 2001; pp. 1-25.
"17.3 RAIDO-Striping," by T. Rhodes and M. Stokely; FreeBSD Handbook, Chpt 17 GEOM: Modular Disk Transformation Framework; pp. 1-3.
"Two Technologies Compared: NOR vs. NAND White Paper," Jul. 3, 91-SR-012-04-81., Rev 1.1, pp. 1-14.
"ATA Flash Disk Controller," 2004 Silicon Storage Technology, Inc.; pp. 1-76.
"512M x8 Bit / 1G x8 Bit NAND Flash Memory," Flash Memory, Samsung Electronics, pp. 1-38.
"RAID," SearchWinSystems.Com Learning Guide: Backup Solutions, pp. 1-3.
"Advanced Technology Attachment," http://foldoc.doc.ic.ac.uk/foldoc.
"Portalplayer, Inc.—Products," http://www.protalplayer.com/products/index.html, pp. 1-5.
PCT Invitation to Pay Additional Fees and, Where Applicable, Protest Fee, PCT/US2008/061463, mailed Sep. 11, 2008, (9 pages).
International Search Report and Written Opinions for PCT Application No. PCT/US2008/061463, dated Jan. 30, 2009 (18 pages).

* cited by examiner

MONITORING HEALTH OF NON-VOLATILE MEMORY

RELATED APPLICATIONS

The subject matter of this patent application is related to U.S. patent application Ser. No. 11/341,252, filed Jan. 27, 2006, entitled "Non-Volatile Memory Management," U.S. application Ser. No. 11/335,968, filed Jan. 20, 2006, entitled "Variable Caching Policy System and Method," U.S. patent application Ser. No. 11/334,293, filed Jan. 18, 2006, entitled "Interleaving Policies For Flash Memory," and U.S. patent application Ser. No. 11/339,750, filed Jan. 25, 2006, entitled "Reporting Flash Memory Operating Voltages,". Each of these patent applications are incorporated by reference herein in its entirety.

TECHNICAL FIELD

The disclosed implementations are related to memory management.

BACKGROUND

Non-volatile memory is commonly used in portable or battery operated devices, such as memory cards, flash drives, media players, digital cameras, mobile phones and the like. Flash memory is a type of non-volatile memory that stores information in an array of floating gate transistors called "cells" which can store one or more bits. Each flash memory chip is divided into blocks. A block is an array of memory cells organized into pages or sectors. Each page can include additional bytes for correcting errors in data read from the memory chip (e.g., error correction codes).

In some flash memory systems, a host system performs reads and writes to logical block addresses (LBAs), which are mapped or translated to physical block addresses of flash memory. This mapping makes flash memory look like a disk drive to the host operating system. Although flash memory can be read or programmed a byte or a word at a time in a random access fashion, it is usually erased a block at a time. Starting with a freshly erased block, any byte within that block can be programmed. Once a byte has been programmed, it typically cannot be changed again until the entire block is erased. Since flash memory has a finite number of erase-write cycles it is desirable to minimize the number of erase-write cycles to prolong the life of the flash memory.

Due to the unique characteristics of flash memory described above, there is a need for systems, methods and devices that can efficiently monitor the health of flash memory and other non-volatile memories, while maintaining compatibility with existing standards and protocols.

SUMMARY

The deficiencies described above are overcome by the disclosed implementations of systems, methods and device for monitoring the health of one or more non-volatile memory devices.

In some implementations, a system for monitoring health of non-volatile memory includes a non-volatile memory device, a memory controller operatively coupled to the non-volatile memory device and configurable to access the non-volatile memory devices in accordance with a memory management policy, and a host processor operatively coupled to the memory controller and configured to retrieve from the memory controller information indicative of the health of the non-volatile memory device.

In some implementations, a method of monitoring health of non-volatile memory includes: requesting information from a memory controller operatively coupled to a non-volatile memory device, where the information is indicative of the health of the non-volatile memory device; and modifying a memory management policy associated with the non-volatile memory device based on the information.

In some implementations, a memory controller includes a first interface adapted for coupling to one or more non-volatile memory devices. A second interface is adapted for coupling to a host processor, and configurable to receive a request from the host processor for information indicative of the health of the one or more non-volatile memory devices. A controller is operatively coupled to the first interface and the second interface, and is configurable to receive the requested information and to send the requested information to the host processor through the second interface.

In some implementations, a system for monitoring health of non-volatile memory includes a non-volatile memory device and a memory controller operatively coupled to the non-volatile memory device and configurable to access the non-volatile memory device in accordance with a memory management policy. A host processor is operatively coupled to the memory controller and configured to retrieve from the memory controller information indicative of the health of the non- volatile memory device. An intermediate device is adapted to be coupled to the host processor for receiving the information and triggering an action associated with the health of the non-volatile memory device.

Other implementations of systems, methods and devices for monitoring the health of non-volatile memory devices are also disclosed.

DETAILED DESCRIPTION

Memory Management System Overview

Figure 1:
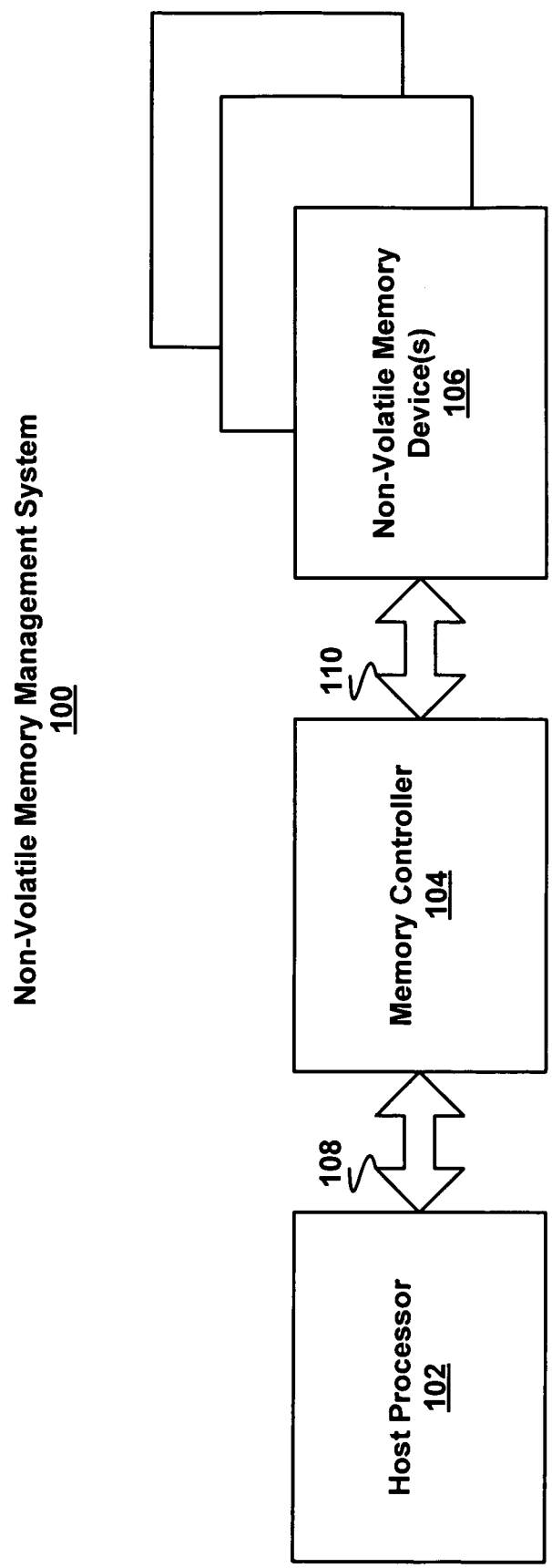
FIG. 1 is a block diagram of an exemplary non-volatile memory management system.

FIG. 1 is a block diagram of an exemplary non-volatile memory management system 100. The system 100 includes a host processor 102, a memory controller 104 and one or more non-volatile memory devices 106. The memory management system 100 can be part of a host system. A host system can be any electronic or computing device that uses non-volatile memory, including but not limited to: flash drives, portable and desktop computers, clients, servers, consumer electronics, calculators, network appliances, media players/recorders, game devices, mobile phones, email devices, personal digital assistants (PDAs), embedded devices, televisions, system-on-chip (SoC), set-top boxes, audio recorders, handheld data collection scanners, monitoring devices, etc.

The memory controller 104 can be any device that manages memory access, including but not limited to: programmable memory controllers, flash disk controllers, direct memory access (DMA) controllers, logic devices, field-programmable gate arrays (FPGAs), central processing units (CPUs), etc. Examples of a memory controller 104 include the family of ATA Flash Disk Controllers (e.g., device nos. SST55LD019A, SST55LD019B, SST55LD019C, etc.), manufactured by Silicon Storage Technology, Inc. (Sunnyvale, Calif.). In some implementations, the memory controller 104 supports single-level cell (SLC) and/or multi-level cell (MLC) flash media.

The non-volatile memory devices 106 can be discrete chips, chipsets and/or memory modules (e.g., single in-line memory modules (SIMMs)). Examples of non-volatile memory devices 106 include but are not limited to: NAND and/or NOR flash media, read-only memory (ROM), erasable, programmable ROM (EPROM), electrically-erasable, programmable ROM (EEPROM), Ferroelectric RAM (Fe-RAM), magnetoresistive RAM (MRAM), non-volatile static RAM (nvSRAM), and any other memory device that does not need its memory contents periodically refreshed and/or can retain information without power.

In some implementations, the memory controller 104 recognizes control, address, and data signals transmitted on bus 108 by the host processor 102. The memory controller 104 translates the control, address and data signals into memory access requests on memory devices 106. In some implementations, the bus 108 is an Integrated Drive Electronics (IDE)/Advanced Technology Attachment (ATA) bus that translates control, address and data signals into memory access requests using IDE/ATA standard bus protocol (e.g., ATA-6 bus protocol).

In some implementations, IDE/ATA signals are generated by the host processor 102. An example of a host processor 102 is the PP5002 SuperIntegration™ SoC controller manufactured by PortalPlayer, Inc. (San Jose, Calif.). The PP5002 provides a platform for media player/recorder systems and other products that use non-volatile memory.

The host processor 102, memory controller 104 and memory devices 106 can be individual chips, a chip set or integrated into a single integrated circuit (e.g., a SoC solution).

System Operation

During operation, one or more memory devices 106 receive signals from the memory controller 104 over Input/Output (I/O) bus 110, which enables the memory devices 106 to perform memory access requests (e.g., read or write operations). In some implementations, the memory devices 106 are interleaved, so that read or write requests to logical block addresses (LBAs) are mapped to physical memory addresses that can span two or more memory devices 106.

In some implementations, an application running on the host processor 102 can request access to data stored on one or more memory devices 106. For example, a user of a media player/recorder may request to save a song to memory. A media player/recorder application sends the request to an operating system (see FIG. 6B). The request is received by the operating system, which formats the request into IDE/ATA signals, which are transmitted to the memory controller 104 on the IDE/ATA bus 108 by the host processor 102. The memory controller 104 translates the request into signals for transmission on the I/O bus 110. The memory device 106 receives the signals from the I/O bus 110 and performs the requested operation.

ATA-6 Standard

ATA-6 is the latest version of the IDE/ATA standard, which was approved by the American National Standards Institute (ANSI) in 2001 under document NCITS 347-2001. Table I lists some examples of standard ATA-6 commands, and is not an exhaustive list. Many other standard and nonstandard commands can be used by the host processor 102 and memory controller 104, including the command extensions described with respect to FIG. 2.

TABLE I

Examples of Standard ATA-6 Commands

| Opcode | Command |
| --- | --- |
| 10h | Recalibrate |
| 20h | Read Sectors |
| 30h | Write Sectors |
| 40h | Read Verify |
| B0h | SMART |
| C8h | Read DMA |
| CAh | Write DMA |
| E0h | Standby Immediate |
| E2h | Standby |
| E7h | Flush Cache |
| ECh | Identify |
| EFh | Set Features |

The IDE/ATA commands listed in Table I can be transmitted to the memory controller 104 via the IDE/ATA bus 108, where they are translated into signals which can be used by a controller and decoding logic in the memory device 106 to access a memory array. For example, when the host processor 102 makes a read request, the "Read Sectors" opcode (20h) is transmitted to the memory controller 104, together with address and control signals for accessing the sector(s).

Memory Controller Overview

Figure 2:
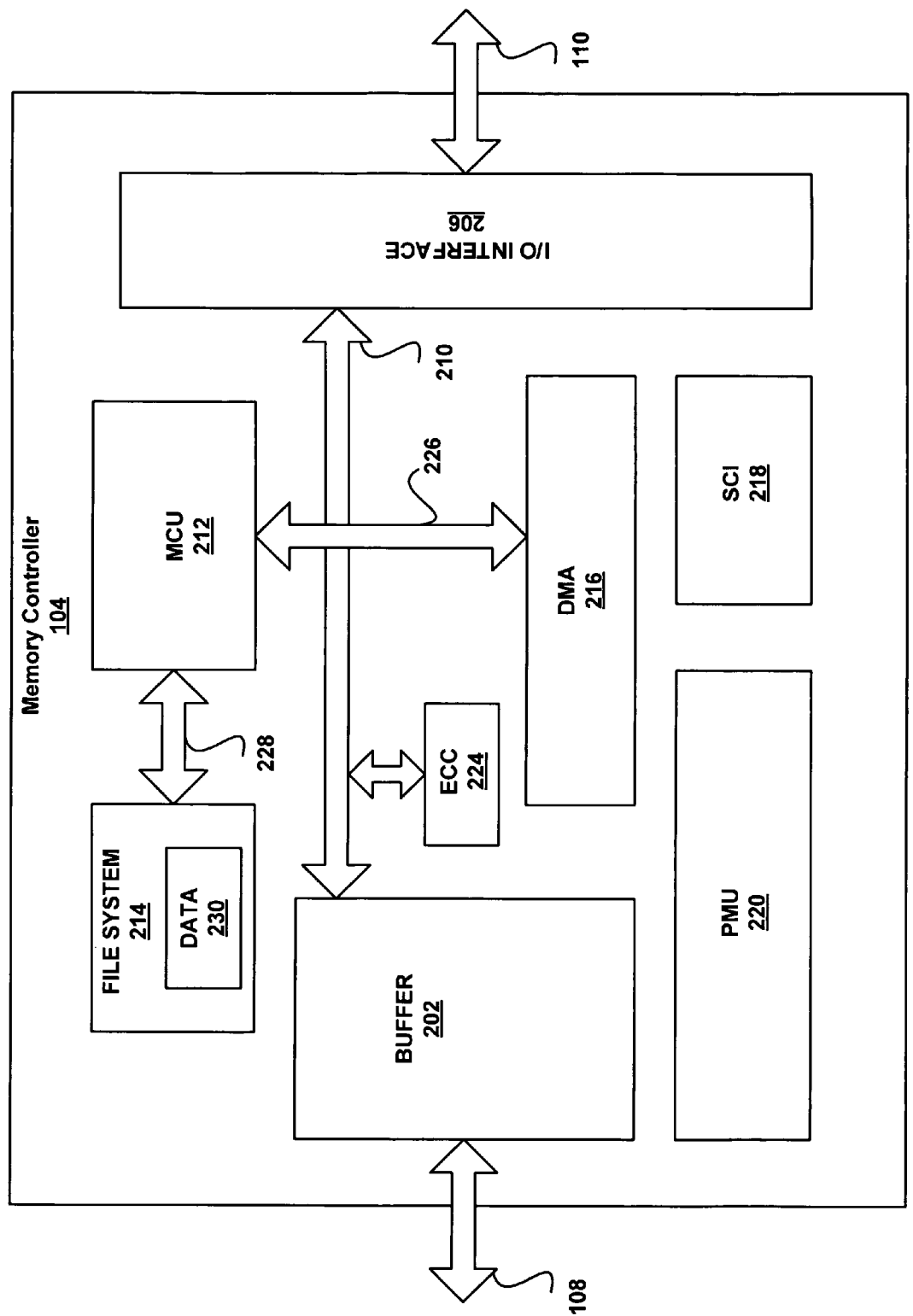
FIG. 2 is a block diagram of the memory controller shown in FIG. 1.

FIG. 2 is a block diagram of the memory controller 104 shown in FIG. 1. The memory controller 104 includes a buffer 202 (e.g., SRAM), an I/O interface 206, a microcontroller unit (MCU) 212, an embedded memory file system 214 (e.g., embedded flash file system), an indirect direct memory access (DMA) 216, a serial communication interface (SCI) 218, a power management unit (PMU) 220 and an error correction code (ECC) 224.

The MCU 212 translates IDE/ATA commands into data and control signals required for memory operations. The MCU 212 is coupled via internal bus 228 to the file system 214 which contains MCU firmware for performing various tasks file management tasks. For example, the MCU firmware can translate signals from host processor 102 into memory read and write operations. If flash media is used, the MCU firmware provides dynamic memory wear-leveling to spread flash writes across unused memory address space to increase the longevity of the flash media. The MCU firmware also keeps track of data file structures and manages system security for selected protective zones in memory. The file system 214 stores data 230, which includes data that is used to change the memory management access policy implemented by the host system. For example, the data 230 can include an electronic signature or serial number for identifying the memory device 106 or its manufacturer, the block size of the memory controller 104, an identification of bad blocks, chip interleave depth, etc. The data 230 can also include information associated with self-monitoring, analysis and reporting technology (SMART).

The MCU 212 is also coupled via internal bus 226 to DMA 216. The memory controller 104 uses the DMA 216 to provide instant data transfer from the buffer 202 to the memory devices 106. The DMA 216 eliminates overhead associated with the MCU firmware, thereby increasing the data transfer rate.

The buffer 202 is coupled to the I/O interface 206 via internal data bus 210. In some implementations, data transmitted on data bus 210 is subject to error detection and correction using an error correction code (e.g., Reed-Solomon error correction code, etc.). The I/O interface 206 provides connectivity to the memory devices 106 through I/O bus 110, and includes circuitry for enabling read, program and erase operations to one or more memory devices 106. In some implementations, the I/O interface 206 is a multitasking interface that allows concurrent read, program and erase operations to multiple memory devices 106.

The PMU 220 controls the power consumption of the memory controller 104. In some implementations, the PMU 220 reduces power consumption of the memory controller 104 by putting part of the circuitry used in the memory controller 104 into a sleep mode.

The SCI 218 enables a user to restart a self-initialization process and to customize drive identification information. The SCI 218 can also be used for manufacturing support.

Memory Device Overview

Figure 3:
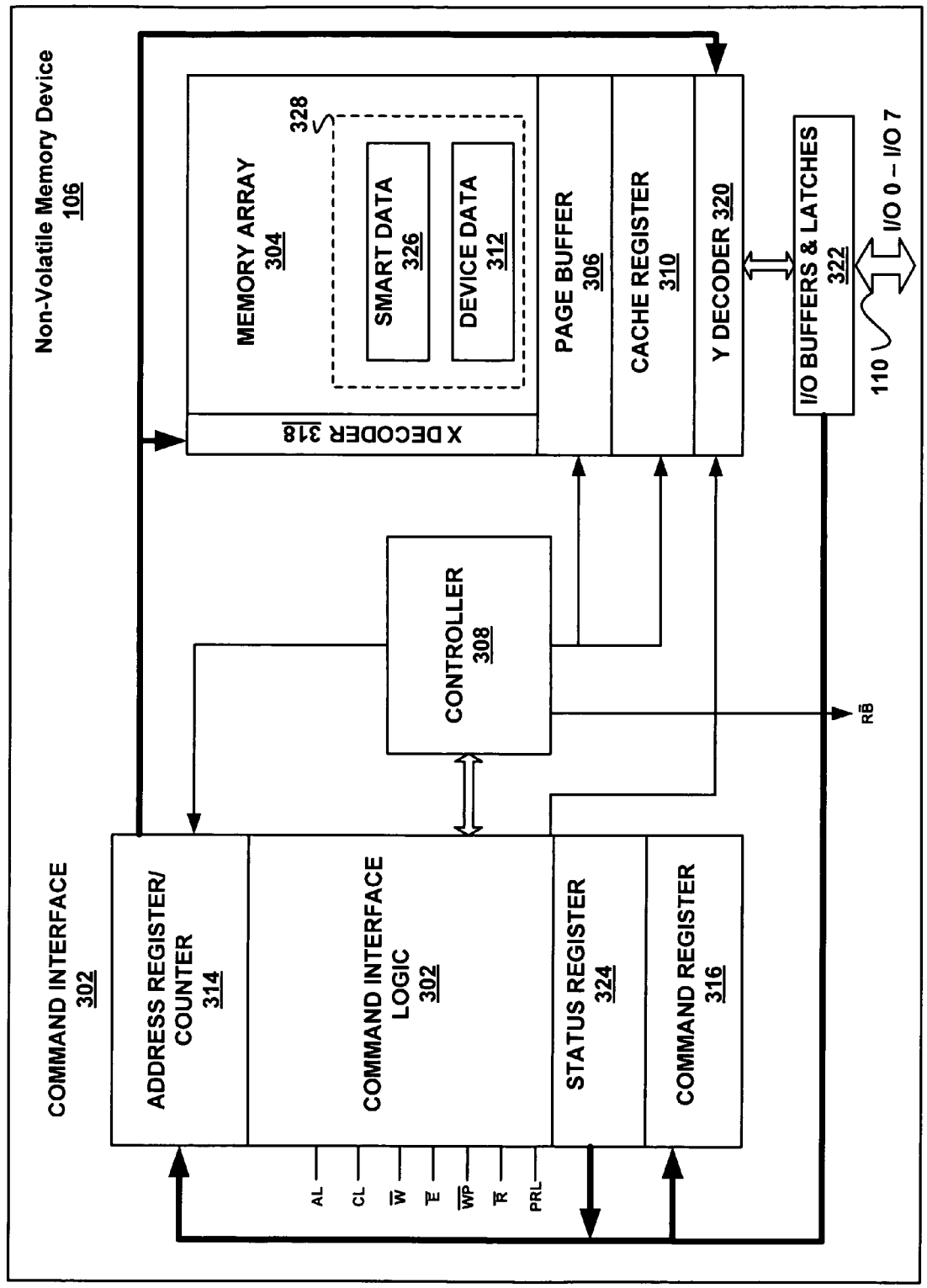
FIG. 3 is a block diagram of the non-volatile memory device shown in FIG. 1.

FIG. 3 is a block diagram of the non-volatile memory device 106 shown in FIG. 1. The memory device 106 generally includes a command interface 302, a memory array 304 and a controller 308. The command interface 302 further includes a command register 316, an address register/counter 314 and a status register 324. The memory array 304 further includes a page buffer 306, an optional cache register 310, x-decoder logic 318 and y-decoder logic 322. The memory array 304 is operatively coupled to I/O buffers & latches 322. The I/O buffers & latches 322 are coupled to memory controller 104 by I/O bus 110. In some implementations, the I/O bus 110 includes eight I/O lines (I/O 0-I/O 7) which are used to: (a) input a selected address, (b) output data during a read operation, or (c) input a command or data during a program operation. Note that in this bus arrangement, the address lines can be multiplexed with data input/output signals. Although the I/O bus 110 is shown with an ×8 width, the I/O bus 110 can have any desired width (e.g., ×16, ×32, etc.), depending on the architecture of the memory controller 104 and memory devices 106.

The memory array 304 is accessed using x-decoder 318 and y-decoder 320. X-decoder 318 decodes input addresses in address register/counter 314 to determine a memory line to be accessed for the read or write operation. A counter in address register 314 keeps track of the current memory line and is incremented by the controller 308. Y-decoder 320 decodes signals from the command interface logic 302 for reading or writing data into the memory line determined by x-decoder 318.

In some implementations, the command interface logic 302 receives and interprets various control signals from the memory controller 104 via the I/O bus 110. These control signals can include but are not limited to: address latch enable (AL), command latch enable (CL), write enable (W), chip enable (E), write protect (WP), read enable (R), power-up, read enable and lock/unlock enable (PRL).

The command register 316 is configured to receive memory commands from the memory controller 104 via I/O bus 110. The address register/counter 314 is configured to receive addresses from the memory controller 104 via I/O bus 110. Thus, I/O bus 110 can receive either command inputs or address inputs depending on the states of the AL and CL signals.

The controller 308 is operatively coupled to the address register 314 and the command register 316 for receiving one or more input addresses and command inputs, which are used by the controller 308 in combination with control signals from the command interface logic 302 to carry out read and write operations on memory array 304. In some implementations, the controller 308 includes memory for storing firmware which can be modified as needed to carry out desired operations (e.g., block replacement, garbage collection, wear-leveling, error correction, etc.). The controller 308 also provides a read/bus signal (RB), which the memory controller 104 can use to determine when the controller 308 is active.

Example Page Program Operation

An example page program operation will now be described. During a page program operation, the controller 308 receives a "page program" command input from the I/O bus 110 in a first bus cycle and stores it in the command register 316. Several bus cycles (e.g., 4 cycles) are then used to input a memory address into address register 314. Next, data stored in I/O buffers & latches 322 is loaded into the page buffer 306. When the page buffer 306 is loaded with data, the controller 308 programs the page into the memory array 304 at the address stored in address register 314 using x-decoder logic 318 and y-decoder logic 320 for row and column address decoding, respectively.

Example Page Read Operation

An example page read operation will now be described. During a page read operation, the controller 308 receives a page read command input from the I/O bus 110 in a first bus cycle and stores it in the command register 316. In some implementations, a random read command may be issued first, followed by a page read command. Several bus cycles (e.g., 4 cycles) are then used to input a memory address into address register 314. Next, data stored in memory array 304 is transferred to the page buffer 306 using x-decoder logic 318 and y-decoder logic 320. The data is read out from the page buffer 306 sequentially (from selected column address to last column address) and stored in I/O buffers & latches 322, where the data can be read out by the memory controller 104.

Cache Operations

In some implementations, the memory device 106 includes optional cache program and read commands which can improve the program and read throughputs for large files. In a cache program, the memory device 106 loads data in the cache register 310, and the data previously stored in the cache register 310 is transferred to the page buffer 306 where it is programmed into the memory array 304. In a cache read, the memory device 106 loads data in the cache register 310, while the previous data in the cache register is transferred to I/O buffers and latches 322, where it can be read out by the memory controller 104.

In some implementations, device data 312 is stored in a spare area 328 of the memory array 304. The device data 312 can be used to identify the memory device 106 and its manufacturer. For example, the device data 312 can include an electronic signature or serial number that includes a manufacturer code and/or device code. Chip data 312 can also include but is not limited to: device type (e.g., NAND, NOR, etc.), device density (e.g., 512 Mb, 1 Gb, 2 Gb, etc.), device operating voltage (e.g., 3.3 volts), page size (1 k, 2K, etc.), spare area size (e.g., 8, 16 bytes, etc.), sequential access time (e.g., 30, 50 nanoseconds, etc.), block size (e.g., 64 k, 128 k, etc.), bus width (e.g., ×8, ×16, etc.), bad block identification, and any other information that is associated with attributes, properties or characteristics of the memory device 106 (collectively, referred to herein as "attributes").

The device data 312 can be transmitted to the memory controller 104 via the I/O bus 110 in response to a read command issued by the memory controller. 104. The device data 312 can be used by the memory controller 104 and/or host system to perform various memory management tasks, as described with respect to FIG. 4.

Memory Management Process

Figure 4:
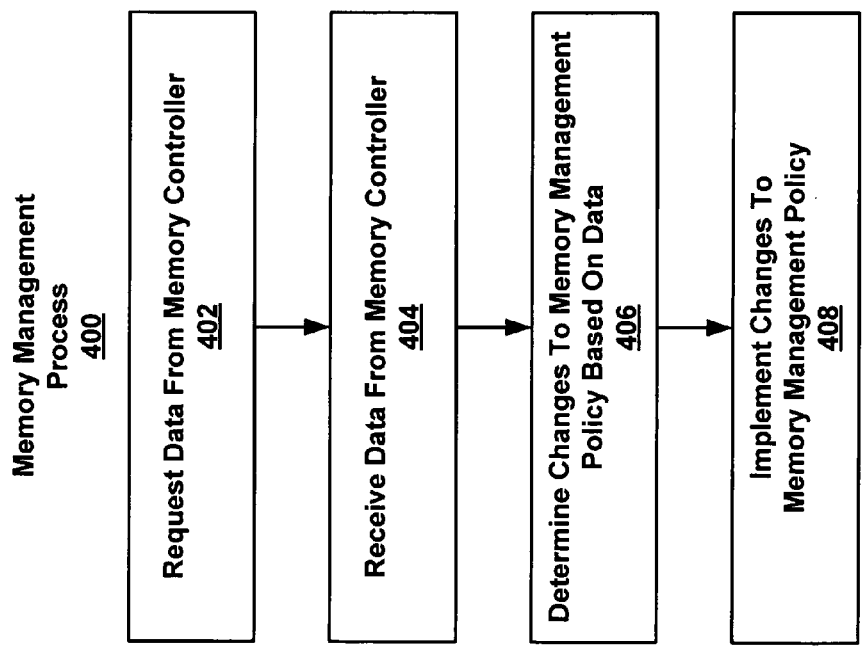
FIG. 4 is a flow diagram of an exemplary memory management process implemented by the management system shown in FIG. 1.

FIG. 4 is a flow diagram of a memory management process 400 implemented by the management system 100 shown in FIG. 1. The steps of process 400 need not be executed in any particular order and, moreover, at least some steps of process 400 can be executed concurrently in a multithreading or multiprocessing environment.

In some implementations, the process 400 begins when a host processor requests data from a memory controller (402). The data can be device-specific data and/or any other data stored in the memory controller (e.g., SMART data) which can be used by the host system to modify its memory management policy. In some implementations, the data is retrieved by the memory controller in response to a request from the host processor during end user operation, or during manufacturing as part of an installation, testing or qualification process. The host processor receives the data from the memory controller (404) and determines changes to a memory management policy (406). The host processor and/or a host operating system can implement the changes to the memory management policy at the file system level (408). Some examples of changes that can be made to the memory management policy can include combining clusters, adjusting virtual sector sizes, aligning file system structures to block sizes so that block boundaries are not crossed, etc. An example of a system and method for changing a caching policy is described in co-pending U.S. patent application Ser. No. 11/335,968, entitled "Variable Caching Policy System and Method,". In some implementations, changes can be made that affect how memory is interleaved, as described in U.S. patent application Ser. No. 11/334,293, entitled "Interleaving Policies For Flash Memory,".

Memory Management Policy

A memory management policy addresses how read and write operations should be performed to improve data throughput, reduce power consumption and to extend the life of memory devices (e.g., when using flash memory).

Memory device information can be used to modify memory management policies. Memory device information can include an electronic signature that is stored in the memory device, which can be used to identify the memory device and/or its manufacturer. In some implementations, the electronic signature can also include other device information, such as block size, minimum voltage levels, page size, bad block data, DMA versions, etc. In other implementations, the memory device information is stored on a computer-readable medium in the host system (e.g., memory, hard disk, CDROM, etc.), as described with respect to FIG. 6. For example, the host system can include pre-stored information for multiple memory devices that are known to be compatible with the host system and the memory controller. Alternatively, the host system can use the electronic signature to retrieve information from other devices that are operatively coupled to the host system, either directly through a port (USB, FireWire, etc.), or indirectly through a network connection (e.g., Internet, intranet, LAN, WLAN, wireless network, etc.).

Block Defining

An example of a memory management policy that can be modified based on memory device information is block defining. Flash is available in a variety of block sizes. Memory access efficiency can be improved by matching the average size of files to be stored in the flash media to the block size of the flash media. Typically, a larger block size relative to an average file size results in less efficient use of the flash media. In some implementations, a file system (e.g., file system 214) marks files that have been selectively deleted as invalid but does not delete those files from the memory array. Rather, the file system programs file-header bits and uses additional available space within the memory array to store replacement or additional files. The memory array, however, may eventually become full of a combination of valid and deleted files, causing the file system to initiate a clean-up management operation (i.e., "garbage collection"). The smaller the average file size relative to the block size, the more likely that a mix of valid and deleted files resides in any block. This results in more "garbage collection" to create block-sized free space. Even if the file system performs garbage collection during periods when the memory controller is not accessing the flash media, the additional program and erase requirements used in garbage collection will impact power consumption.

On the other hand, using small blocks relative to the average file size can result in additional on-chip peripheral circuits to decode and isolate a block from other blocks, which can impact die size and cost. A block that is significantly smaller than the average file may also burden the file system with multiple block erases per file operation, resulting in an increase in power consumption.

For certain systems (e.g., multimedia players/recorders) it may be advantageous to tailor the size of files such that the average file size is proportional to the block size. For example, the host system can use the block size and interleave depth to determine an average file size. Since the host system typically knows the types and sizes of files to be stored, the host system can use that information, together with block size information, to determine how to efficiently write files to the memory devices. This may include dividing large files into two or more segments, changing the amount of caching in the host system, and/or dynamically remapping or clustering LBAs in the host system. In some implementations, the host system can use block size information to align a file system structure so that block boundaries are not crossed during read or write operations.

Identifying DMA Mode

Another example of a memory management policy that can be modified based on memory device information is DMA mode identification. In some implementations, a host system supports DMA and Programmed I/O (PIO) bus mastering protocols. In general, DMA is a high speed data transfer to or from a memory device that allows the host system to move data directly to and from the memory array with very few state changes. PIO protocol uses registers and commands, and PIO data transfers take place relative to the level of read and write strobe lines to clock the transfer of data across the interface. In some implementations, the host processor 102 and the memory controller 104 can support multiple DMA versions (e.g., multiword DMA, Ultra DMA, etc.). In such systems, the host processor 102 can request the DMA version from the memory controller 104 and reconfigure its hardware and/or firmware to accommodate the DMA version.

In some implementations, the DMA mode identification can be used by the host processor 102 or a power manager chip to manage power consumption by controlling the number and/or frequency of DMA read and write requests.

Wear-Leveling

Another example of a memory management policy that can be modified based on memory device information is wear-leveling. Wear leveling can be improved by the host system controlling the number and/or frequency of writes made to non-volatile memory.

Bad Block Management

In some implementations, the memory array is made up of NAND structures where multiple memory cells (e.g., 32) are connected in series. The memory array is organized into blocks where each block contains multiple pages (e.g., 64). Often some of the blocks are determined to be bad during testing. A bad block is a block that contains one or more bits whose reliability is not guaranteed. Additionally, bad blocks may develop during the lifetime of the memory device. In some implementations, bad block information can be included in SMART data stored in a spare area of a memory array prior to shipping the memory device, as described with respect to Table III.

A bad block can be replaced by copying the data in the bad block to a valid block. In some implementations, bad blocks are identified in response to failed attempts to program or erase the blocks. For example, if a block program or erase fails, an error code can be programmed in the status register, where it can be read out by the memory controller 104 and transmitted to the host processor 102.

The host operating system can use the bad block information to avoid writing to bad blocks and/or adjust the operating system writing policy to reduce the number and/or frequency of writes to memory. For example, if the number of bad blocks reaches a certain critical threshold (e.g., 1.5% of available blocks), the writing policy of the host operating system can be changed, so that writes are made only when necessary. Additionally, the host operating system can notify the user when the number of bad blocks or wear level exceeds a predetermined value, so that the user can take action, such as replacing the bad memory or the device. In some implementations, the host operating system can automatically trigger a service order which can be transparent to the user.

The ability to request and receive memory device information for use in the host system, and to modify memory access policies based on that information in combination with application-level or operating system-level information, can provide significant improvements over conventional memory management systems.

IDE/ATA Command Extensions

In some implementations, a host process 102 can request and receive memory device information (e.g., signatures, block size, interleave date, etc.) for one or more memory devices 106 over a standard IDE/ATA bus by extending one or more standard IDE/ATA commands. Examples of extensions to the ATA-6 "identify" command are lists in Table II below.

TABLE II

Example Extension of ATA-6 Identify Command

| Words | Hex | Description |
|---|---|---|
| N through N + 1 | F | $1^{st}$ chip NAND read ID data |
| N + 2 through N + 3 | F | $2^{nd}$ chip NAND read ID data |
| N + 4 through N + 5 | F | $3^{rd}$ chip NAND read ID data |
| . . . | F | $4^{th}$ chip NAND read ID data |
| . . . | F | N-way of interleave |
| . . . | F | NAND flash block size |
| . . . | F | Minimum operating voltage level (millivolts). |

Referring to Tables I & II, the ATA-6 "identify" command can be augmented with additional bytes (e.g., two words per device) for storing memory device information returned by the memory controller in response to the "identify" command. The number of additional bytes used to augment the command can depend on the number of memory devices 106. For example, in a system that includes eight NAND memory devices (i.e., 8 chips), two words can be reserved for each chip for storing memory device information returned by the memory controller 104. If an "identify" command is issued by the host processor 102 to the memory controller 104 over an IDE/ATA bus, then 16 words of memory device information (e.g., electronic signature, block size, etc.) can be returned by the memory controller 104. In this example, words N and N+1 can store NAND read ID data for chip number one. Bits 15-8 can contain the first read ID data byte, and bits 7-0 can contain the second read ID data byte. Likewise, words N+2 and N+3 can store NAND read ID data for the chip number two, words N+4 and N+5 can store NAND read ID data for chip number three, and so forth.

In some implementations, the "identify" command can be extended to include a return field for a parameter that identifies the amount of chip interleaving (e.g., n-way interleaving). For example, in addition to the read ID data for each chip, an integer indicating the interleave level among the 8 chips will be returned to the host processor 102. In some implementations, a "0" indicates no interleaving between the chips, a "2" indicates a 2-way interleave (i.e., two chips), a "3" indicates a 3-way interleave (i.e., 3 chips), a "4" indicates a 4-way interleave (i.e., 4 chips), and a "5" indicates 5-way interleave (i.e., 5 chips). Some chip interleave information can be used to optimize memory operations, as described in U.S. patent application Ser. No. 11/334,293, entitled "Interleaving Policies For Flash Memory,".

In implementations that use flash media, the "identify" command can be extended to include a return field for a parameter that identifies the block size used by the memory controller. The block size can be used, for example, in block defining, as previously described.

In some implementations, the "identify" command can be extended to include a return field for a parameter that identifies the value of the minimum operating voltage level. The host system can use this parameter to stop operation of the memory controller 104 or memory device 106 if the minimum voltage level is reached, thus reducing the possibility of data errors due to low voltage conditions. An exemplary system and method for using minimum operating voltage level information to control the operation of a memory controller 104 is described in co-pending U.S. patent application Ser. No. 11/339,750, entitled "Reporting Flash Memory Operating Voltages,".

SMART Read Data Extensions

Referring again to FIG. 3, in some implementations health monitoring logic can be incorporated into a memory device 106 and/or a memory controller 104 to act as an early warning system for pending problems in the memory device 106 and/or the memory controller 104. The intent of health monitoring is to protect user data and minimize the likelihood of unscheduled system downtime that may be caused by predictable degradation and/or fault of a user system or device. By monitoring and storing critical performance and calibration parameters, devices attempt to predict the likelihood of near-term degradation or fault condition. Providing a host system the knowledge of a negative reliability condition allows the host system to warn the user of the impending risk of data loss and advise the user of appropriate action.

In some implementations, the health monitoring logic can be implemented using SMART technology. SMART technology was originally developed for use with hard drives, and is described in SFF Committee, *Specification Self-Monitoring, Analysis and Reporting Technology* (S.M.A.R.T.), SFF-8035i, revision 2.0, Apr. 1, 1996, which is incorporated herein by reference in its entirety.

In some implementations, the memory controller 104 works with one ore sensors located in the memory device 106 and/or the memory devices 106 to: (1) monitor various performance aspects of the memory device 106 or memory controller 104 ; (2) determine from this information if the memory device 106 or memory controller 104 is behaving normally or not; and (3) to make available status information to the host system (e.g., via the status register 324 of the memory device 106), so that appropriate actions can be taken by the host system.

Table III below is an example of a SMART read data structure that includes read data extensions.

TABLE III

Examples of SMART Read Data Structure

| Byte | Length | Description |
|---|---|---|
| 0 | 2 | Smart Revision |
| 2 | 12 | Smart Attribute 1 |
| 14 | 12 | Smart Attribute 2 |
| 26 | 12 | Smart Attribute 3 |
| 38 | 12 | Smart Attribute 4 |
| 50 | 12 | Smart Attribute 5 |
| 62 | 12 | Smart Attribute 6 |
| 74 | 12 | Smart Attribute 7 |
| ... | ... | ... |
| ... | ... | Smart Attribute M |
| 362 | 1 | Offline Data Collection Status |
| 363 | 1 | Self-Test Execution Status |
| 364–365 | 2 | Total time in seconds to complete off-line data collection |
| 366 | 1 | VS |
| 367 | 1 | Off-line data collection capability |
| 368–369 | 2 | SMART capability |
| 370 | 1 | Error logging capability |
| 371 | 1 | Vendor specific |
| 372 | 1 | Short self-test routine time (in minutes) |
| 373 | 1 | Extended self-test routine time (in minutes) |
| 374–385 | 12 | Reserved |
| 394–510 | 117 | Vendor specific |
| 511 | 1 | Data structure checksum |

Because the SMART specification does not specifically address flash media, Table III includes read data extensions for attributes that are particular to flash media. For systems that include 8 memory device chips, bytes 0-74 of the read data structure are included for reporting SMART attributes for chips 1-8. Each SMART attribute includes a SMART attribute structure having several parameters. An example of a SMART attribute structure is shown in Table IV below.

TABLE IV

Example of SMART Attribute Structure

| Byte | Length | Description |
|---|---|---|
| 0 | 1 | Attribute ID |
| 1 | 2 | Status Flags |
|   |   | Bits 6–7: reserved |
|   |   | Bit 5: self-preserving attribute |
|   |   | Bit 4: event count attribute |
|   |   | Bit 3: error rate attribute |
|   |   | Bit 2: performance attribute |
|   |   | Bit 1: online collection attribute |
|   |   | Bit 0: pre-failure attribute |
| 3 | 1 | Normalized attribute value |
| 4 | 1 | Normalized worse value |
| 5 | 6 | Raw value |
| 11 | 1 | Reserved |

Referring to Table IV, each chip is associated with a SMART attribute structure. Each attribute includes an attribute ID, status flags, a normalized attribute value, a normalized worse value and a raw value. Attributes are specific performance or calibration parameters that are used in analyzing the status of a memory device 106. In some implementations, the attribute ID can be an 8-bit unsigned integer in the range from 0-255, allowing for 256 possible attributes per memory device. The status flags can be single bits that are toggled between "0" and "1". The status flags can be associated with specific types of attributes. For example, bit 0 can indicate a pre-failure attribute, bit 1 can indicate an online collection attribute, bit 2 can indicate a performance attribute, bit 3 can indicate an error rate attribute, bit 4 can indicate an event count attribute and bit 5 can indicate a self-preserving attribute.

Examples of SMART attributes that can be supported by the memory management system 100 are listed and described in Table V below.

TABLE V

Examples of SMART Attributes

| Attribute ID | Name | Raw Val. | Description |
|---|---|---|---|
| 1 | 1-bit ECC error count | The number of reads requiring 1-bit of ECC correction | Tracks the number of read requests by the memory controller where 1-bit of error correction is required. |

TABLE V-continued

Examples of SMART Attributes

| Attribute ID | Name | Raw Val. | Description |
|---|---|---|---|
| 2 | 2-bit ECC error count | The number of reads requiring 2-bit of ECC correction | Tracks the number of read requests by the memory controller where 2-bit of error correction is required. |
| 3 | Factory scan bad NAND blocks | The number of blocks marked bad during controller initialization | Tracks the number of NAND blocks marked bad during the NAND initialization process by the memory controller. These are blocks that will not be used by the memory controller during operation. |
| 4 | Incremental NAND bad blocks | The number of blocks marked bad during controller operation, excluding the factory scan bad blocks | Tracks the number of NAND blocks marked bad during memory controller operation. |

Referring to Table V, attribute IDs 1 and 2 track 1-bit and 2-bit error counts, respectively, as determined by ECC hardware and firmware (e.g., ECC 224 in FIG. 2) in the memory controller 104. Generally, n-bit error counts can be monitored. Large ECC error counts may indicate bad blocks or a pending component failure. These attributes can be used by the host system for bad block management and/or wear-leveling by, for example, not writing to bad blocks and/or by controlling the number and/or frequency of write operations to memory.

Attribute IDs 3 and 4 track bad blocks from factory scans prior to shipping, and also track incremental bad blocks that may develop during operation, respectively. These attributes can be used by the host system for bad block management, as previously described. An advantage provided by attribute ID 3 is that knowing the percentage of bad blocks enables device manufacturers to categorize and price devices based on actual storage capacity. For example, a device manufacturer may sell a device having an advertised flash memory capacity of 20 GB for $200 dollars and another device having an advertised flash memory capacity of 40 GB for $400 dollars. During testing, it can be determined that a flash memory device has too many bad blocks to meet the specifications of the 40 GB device but is still within the specifications of the 20 GB device. The manufacturer can simply categorize the device appropriately without discarding the device or memory chip, saving potentially millions of dollars in lost revenue due to bad blocks.

Note that the raw values described in Table V can be normalized to ensure that the raw value fall within a desired range to facilitate comparison with attribute threshold values (e.g., the normalized worse value). Also, the number and type of attributes can be increased or decreased based on design specifications.

Health Monitoring Data Collection and Analysis

Figure 6A:
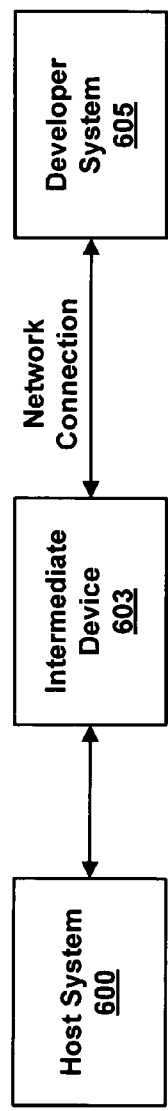
FIG. 6A is a block diagram of an exemplary communication system for communicating health monitoring information.

In some implementations, health monitoring information can be used by a host system to predict the likelihood of near-term degradation or fault condition, and to use the health monitoring information to invoke a preventative measure. In other implementations, the information can be collected by a host system 600 (e.g., a media player/recorder, mobile phone, etc.) but analyzed at another location, such as a developer system 605 or intermediate device 603 (e.g., a personal computer), as shown in FIG. 6A.

Figure 5:
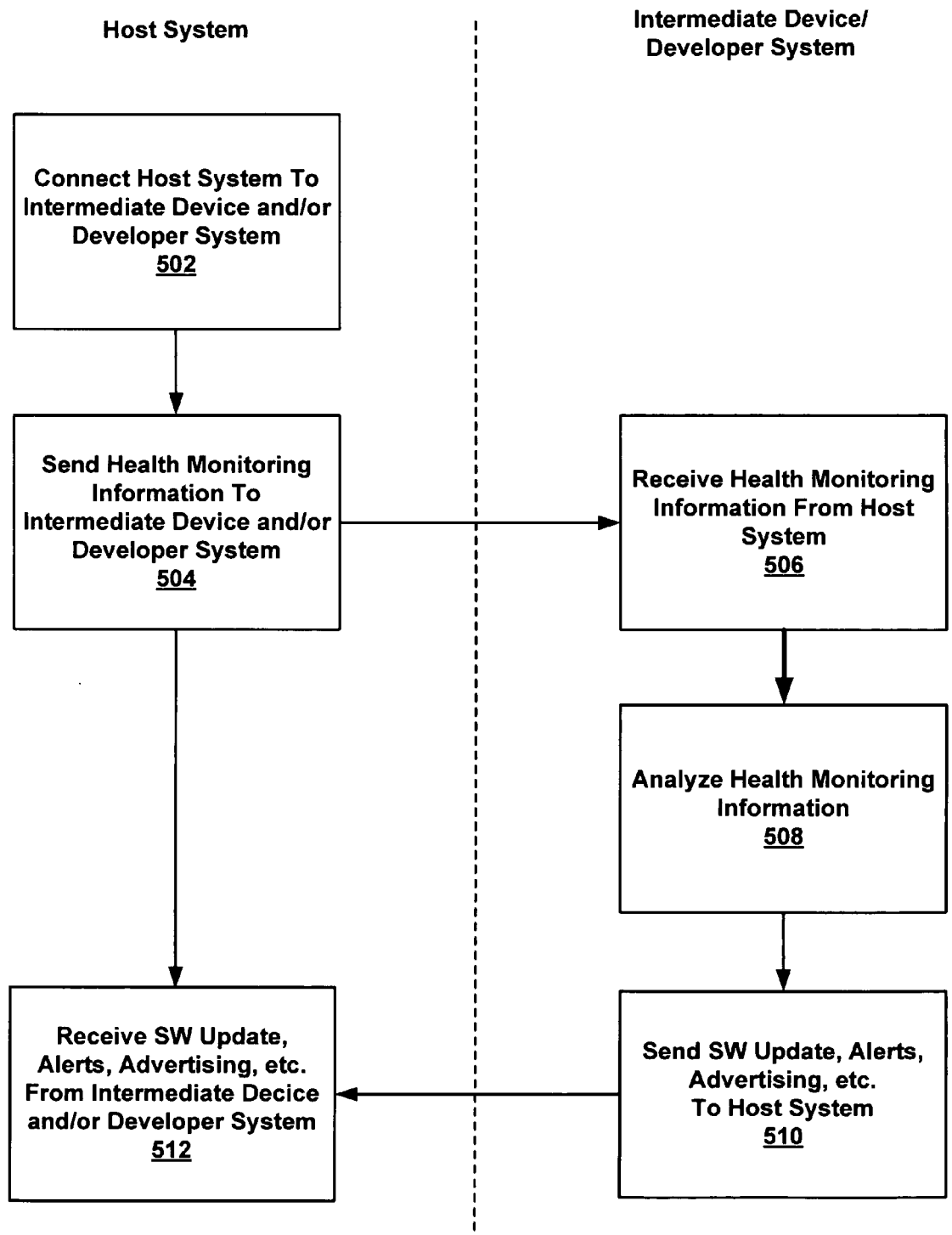
FIG. 5 is a flow diagram of an exemplary health monitoring information collection and analysis process.

FIG. 5 is a flow diagram of an exemplary health monitoring information collection and analysis process. In some implementations, the user connects a host system to an intermediate device and/or a developer system (502). In such a configuration, the host system can be referred to as a "tethered" device. Examples of intermediate devices include but are not limited to: personal computers, mobile phones, PDAs, game consoles, set-top boxes, etc. The connection can be through any known bus, such as Universal Serial Bus (USB) or FireWire. For example, a user can connect a media player/recorder to a desktop computer through a USB port. In some implementations, the connection can be automatically detected, and software residing on the intermediate device (e.g., a personal computer) automatically requests and receives health monitoring information from the host system (e.g., a media player/recorder) and optionally sends it to a developer system (504) through, for example, a network connection (e.g., the Internet, intranet, Ethernet, wireless network, etc.). A developer system can be, for example, a website operated by the manufacturer of the host system. The intermediate device and/or developer system receives the health monitoring information from the host system (506) and analyzes the SMART data (508) using known error analysis techniques. For example, the information can include ECC error counts and/or ECC error rates which can be used to predict the failure of a memory device or memory controller. In some implementations, the developer system takes control of the host system and scans the memory of the user device for health monitoring information (e.g., SMART data) or other useful information.

In some implementations, if a pending component failure is predicted, the user's data can be transferred to storage device at the developer system to prevent its loss or to maintain its integrity. The transfer can be initiated by the user or programmatically by the host system, an application or remotely by the developer system. In some implementations, software or firmware on the host system can be partially or completely replaced with new software or firmware.

Based on the analysis of health monitoring information, the intermediate device and/or developer system can send software updates or alerts to the host system (510) using one or more modes of communication (e.g., email or snail mail, telephone call, instant message, etc.). For example, if the intermediate device and/or developer system determines that a component in the host system is pending failure, then the intermediate device and/or developer system can send an email message to the user. In some implementations, a new device or component can be automatically shipped to the user when a failure a pending failure is predicted. In other implementations, an advertisement or other commercial message can be sent to the user to entice them to buy a new device, more memory, etc. The message can include a URL directing the user to a web page for browsing and purchasing products and/or services.

In some implementations, the intermediate device 605 (e.g., a personal computer) performs data collection and analysis and notifies the user of any pending failures. For example, an application running on the intermediate device 605 can be connected to the host system 600 and can request information from the memory controller regarding the type of memory devices 106 being used by the host system 600. The request can be implemented by the host processor 102 in the form of an "identify" command that returns a chip ID. The chip ID can be used by an application running on the intermediate device 605 to look-up information about the memory devices 106, including but not limited to: block size, wear life, erase time, write speed, etc. The application can use this memory device information to control the number and/or frequency of write operations to the memory devices 106 at the file system level.

In some implementations, an application or device that performs data synchronization with other applications and devices (e.g., digital media players, PDAs, smart phones, etc.) can use the memory device information to change its policy on synchronizing data. For example, syncing with memory devices 106 that include multi-level cell (MLC) technology can be performed at a different frequency than with memory devices 106 that include single-level cell technology (SLC).

Optionally, the intermediate device 603 can establish communication with a developer system 605 to inform the developer system 605 of pending failures. The developer system 605 can issue a service order, ship a new device or perform any other service to address the problem, as previously described.

Host System Hardware Architecture

Figure 6B:
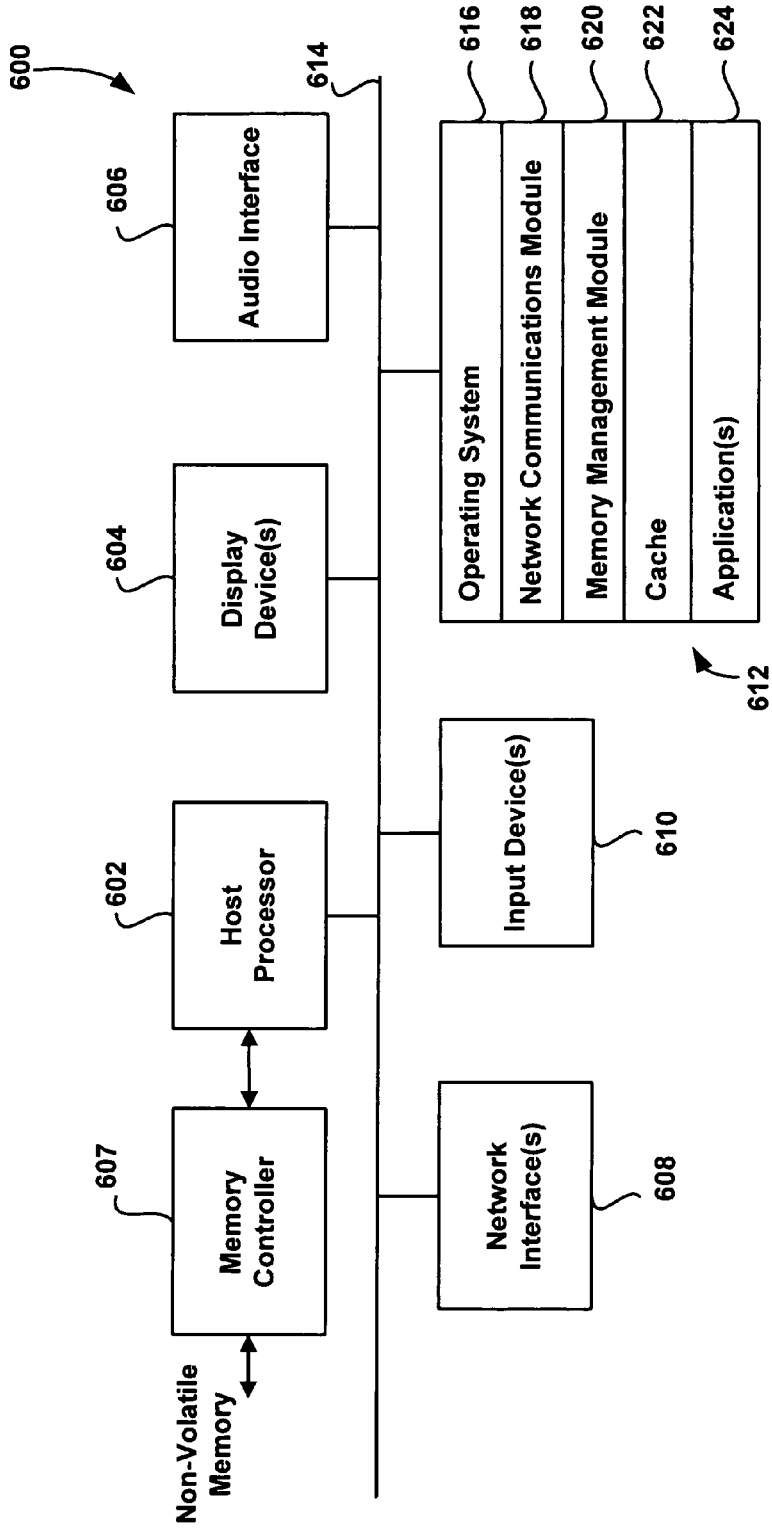
FIG. 6B is block diagram of an exemplary hardware architecture for a host system that includes the memory management system shown in FIG. 1.

FIG. 6B is block diagram of a hardware architecture 600 for the host system 600 shown in FIG. 1. Although the hardware architecture is typical of a computing device (e.g., a personal computer), the disclosed implementations can be realized in any device capable of presenting a user interface on a display device, including but not limited to: desktop or portable computers; electronic devices; telephones; mobile phones; display systems; televisions; monitors; navigation systems; portable media players; personal digital assistants; game systems; handheld electronic devices; and embedded electronic devices or appliances.

The host system 600 includes one or more host processors 602 (e.g., PowerPC®, Intel Pentium®, etc.), one or more display devices 604 (e.g., CRT, LCD, etc.), an audio interface 606 (e.g., a sound card for interfacing with speakers), a memory controller 607, one or more network interfaces 608 (e.g., USB, Ethernet, FireWire® ports, etc.), one or more input devices 610 (e.g., mouse, keyboard, etc.) and one or more computer-readable mediums 612. Each of these components can be coupled by one or more buses 614 (e.g., EISA, PCI, USB, FireWire®, NuBus, PDS, etc.). The memory controller 607 is operatively coupled to the host processor 602 and one or more non-volatile memory devices 106 (see FIG. 1).

The term "computer-readable medium" refers to any medium that participates in providing instructions to a processor 602 for execution, including without limitation, non-volatile media (e.g., optical or magnetic disks), volatile media (e.g., memory) and transmission media. Transmission media includes, without limitation, coaxial cables, copper wire and fiber optics. Transmission media can also take the form of acoustic, light or radio frequency waves.

The computer-readable medium(s) 612 further includes an operating system 616 (e.g., Mac OS®, Windows®, Unix, Linux, etc.), a network communications module 618, a memory management module 620, a cache 622 and one or more applications 624. The operating system 616 can be multi-user, multiprocessing, multitasking, multithreading, real-time and the like. The operating system 616 performs basic tasks, including but not limited to: recognizing input from input devices 610 ; sending output to display devices 604 ; keeping track of files and directories on storage devices 612 ; controlling peripheral devices (e.g., disk drives, printers, image capture device, etc.); and managing traffic on the one or more buses 614.

The network communications module 618 includes various components for establishing and maintaining network connections (e.g., software for implementing communication protocols, such as TCP/IP, HTTP, Ethernet, USB, FireWire®, etc.).

The memory management module 620 works with the host processor 602 and the memory controller 607 to implement the various memory management processes described with respect to FIGS. 2-5. In some implementations, some or all of the processes performed by the memory management module 620 can be integrated into the operating system 616. The disclosed implementations can be implemented in digital electronic circuitry, computer hardware, firmware, software, or any combination thereof.

The cache 622 can be used for caching data in accordance with a memory management policy, as described with respect to FIGS. 2 and 3.

Other applications 624 can include any other software application, including but not limited to: word processors, browsers, email, Instant Messaging, media players, telephony software, etc.

Various modifications may be made to the disclosed implementations and still be within the scope of the following claims.

What is claimed is:

1. A computer-implemented method for monitoring health of a flash memory device, the method comprising:
    collecting, by the flash memory device, information indicating health of memory of the flash memory device, wherein the information indicating the health of the memory is collected by the flash memory device during normal operation of the flash memory device, wherein normal operation of the flash memory device includes operation when the flash memory device is not connected to the external computing device;
    receiving, at the flash memory device from an external computing device, a request for the collected health information;
    transmitting, by the flash memory device, the collected health information to the external computing device, wherein the external computing device is configured to analyze the collected health information to determine a level of health of the memory in the flash memory device;
    receiving, at the flash memory device from the external computing device, a command to perform an operation determined by the external computing device based upon the determined level of health of the memory in the flash memory device; and
    in response to receiving the command, performing, by the flash memory device, the operation.

2. The computer-implemented method of claim 1, wherein the information indicating the health of the memory includes information related to error correction code (ECC) error counts for the memory.

3. The computer-implemented method of claim 1, wherein the information indicating the health of the memory device includes information related to ECC error rates for the memory.

4. The computer-implemented method of claim 1, wherein the information indicating the health of the memory device includes information associated with self-monitoring, analysis and reporting technology (SMART).

5. The computer-implemented method of claim 1, wherein the command to perform the operation includes a command to update at least one of software or firmware used by the flash memory device; and
 wherein performing the operation includes updating, by the flash memory device, at least one of the software or the firmware as indicated in the command.

6. The computer-implemented method of claim 1, wherein the command to perform the operation includes a command to transfer data stored in the memory of the flash memory device to the external computing device; and
 wherein performing the operation includes transmitting, from the flash memory device, the data specified in the command to the external computing device.

7. The computer-implemented method of claim 1, wherein the command to perform the operation includes a command to configure the flash memory device to limit write operations performed to the memory of the flash memory device; and
 wherein performing the operation includes updating configuration information on the flash memory device to limit write operations as specified in the command.

8. The computer-implemented method of claim 7, wherein the configuration information is updated to limit a number or frequency of write operations performed by the flash memory device.

9. A computer-implemented method for monitoring health of a flash memory device, the method comprising:
 initiating control by an external computing device over operation of a flash memory device;
 using the initiated control over the flash memory device, scanning the flash memory device for information indicating health of memory of the flash memory device;
 receiving, at the external computing device from the flash memory device, the information indicating the health of the memory of the flash memory device;
 analyzing, by the external computing device, the received health information to determine a level of health of the memory in the flash memory device;
 determining, by the external computing device, an action related to the flash memory device to perform based upon the determined level of health of the memory of the flash memory device; and
 initiating, by the external computing device, the determined action.

10. The computer-implemented method of claim 9, wherein the determined level of health of the memory of the flash memory device provides an indication of near-term degradations or fault conditions in the memory of the flash memory device.

11. The computer-implemented method of claim 10, wherein, when a near-term failure of at least a portion of the memory in the flash memory device is indicated by the determined level of health of the memory, the determined action includes transmitting a command to the flash memory device to transfer data stored in the memory to the external computing device.

12. The computer-implemented method of claim 10, wherein, when a near-term failure of at least a portion of the memory in the flash memory device is indicated by the determined level of health of the memory, the determined action includes transmitting a message to a user that notifies the user of the near-term failure.

13. The computer-implemented method of claim 9, wherein the determined action includes initiating an update of at least one of software or firmware on the flash memory device.

14. The computer-implemented method of claim 9, further comprising:
 transmitting, from the external computing device to the flash memory device, a request for information identifying hardware including the memory of the flash memory device;
 receiving, at the external computing device, the identifying information;
 identifying, by the external computing device, hardware details of the memory of the flash memory device using the received identifying information;
 determining, by the external computing device, limits for write operations performed on the memory of the flash memory device based upon the identified hardware details of the memory of the flash memory device; and
 wherein the determined action includes transmitting a command to the flash memory device to restrict the number or frequency of write operations according to the determined limits.

15. The computer-implemented method of claim 14, wherein the hardware details include one or more of the following: a block size of the memory, a wear life of the memory, an erase time of the memory, and a write speed of the memory.

16. A flash memory device comprising:
 a computer-readable storage medium storing instructions; and
 a processor that is configured to execute the stored instructions, wherein execution of the stored instructions causes the processor to:
  collect, by the flash memory device, information indicating health of memory of the flash memory device, wherein the information indicating the health of the memory is collected by the flash memory device during normal operation of the flash memory device, wherein normal operation of the flash memory device includes operation when the flash memory device is not connected to the external computing device;
  receive, at the flash memory device from an external computing device, a request for the collected health information;
  transmit, by the flash memory device, the collected health information to the external computing device, wherein the external computing device is configured to analyze the collected health information to determine a level of health of the memory in the flash memory device;
  receive, at the flash memory device from the external computing device, a command to perform an operation determined by the external computing device based upon the determined level of health of the memory in the flash memory device; and
  in response to receiving the command, perform, by the flash memory device, the operation.

17. The flash memory device of claim 16, wherein the information indicating the health of the memory includes information related to error correction code (ECC) error counts for the memory.

18. The flash memory device of claim 16, wherein the information indicating the health of the memory device includes information related to ECC error rates for the memory.

19. The flash memory device of claim 16, wherein the information indicating the health of the memory device includes information associated with self-monitoring, analysis and reporting technology (SMART).

20. A computing device external to a flash memory device for monitoring health of the flash memory device, the external computing device comprising:
- a computer-readable storage medium storing instructions; and
- a processor that is configured to execute the stored instructions, wherein execution of the stored instructions causes the processor to:
  - initiate control by the external computing device over operation of a flash memory device;
  - using the initiated control over the flash memory device, scan the flash memory device for information indicating health of memory of the flash memory device;
  - receive, at the external computing device from the flash memory device, the information indicating the health of the memory of the flash memory device;
  - analyze, by the external computing device, the received health information to determine a level of health of the memory in the flash memory device;
  - determine, by the external computing device, an action related to the flash memory device to perform based upon the determined level of health of the memory of the flash memory device; and
  - initiate, by the external computing device, the determined action.

21. The computing device of claim 20, wherein the determined level of health of the memory of the flash memory device provides an indication of near-term degradations or fault conditions in the memory of the flash memory device.

22. The computing device of claim 20, wherein the determined action includes initiating an update of at least one of software or firmware on the flash memory device.

23. The computing device of claim 20, wherein execution of the stored instructions further causes the processor to:
- transmit, from the external computing device to the flash memory device, a request for information identifying hardware including the memory of the flash memory device;
- receive, at the external computing device, the identifying information;
- identify, by the external computing device, hardware details of the memory of the flash memory device using the received identifying information;
- determine, by the external computing device, limits for write operations performed on the memory of the flash memory device based upon the identified hardware details of the memory of the flash memory device; and
- wherein the determined action includes transmitting a command to the flash memory device to restrict the number or frequency of write operations according to the determined limits.

* * * * *

UNITED STATES PATENT AND TRADEMARK OFFICE
CERTIFICATE OF CORRECTION

PATENT NO. : 7,861,122 B2  
APPLICATION NO. : 11/341359  
DATED : December 28, 2010  
INVENTOR(S) : Michael J. Cornwell et al.

It is certified that error appears in the above-identified patent and that said Letters Patent is hereby corrected as shown below:

On page 2, in column 2, under "Other Publications", line 7, delete "Quantam" and insert -- Quantum --, therefor.

In column 1, line 14, delete "Voltages, "." and insert -- Voltages". --, therefor.

In column 5, line 44, delete "(I/O 0-I/O 7 )" and insert -- (I/O 0-I/O 7) --, therefor.

In column 8, line 24-25, delete "214 )" and insert -- 214) --, therefor.

In column 11, line 25, before "Self-Monitoring," insert -- For --.

In column 11, line 31, delete "ore" and insert -- or more --, therefor.

In column 11, line 34, delete "104 ;" and insert -- 104; --, therefor.

In column 14, line 9, delete "(502 )." and insert -- (502). --, therefor.

In column 14, line 22, delete "(504 )" and insert -- (504) --, therefor.

In column 14, line 27, delete "(506 )" and insert -- (506) --, therefor.

In column 14, line 28, delete "(508 )" and insert -- (508) --, therefor.

In column 15, line 66, delete "610 ;" and insert -- 610; --, therefor.

In column 15, line 67, delete "604 ;" and insert -- 604; --, therefor.

In column 16, line 1, delete "612 ;" and insert -- 612; --, therefor.

Signed and Sealed this  
First Day of November, 2011

David J. Kappos  
*Director of the United States Patent and Trademark Office*